United States Patent
Park et al.

(10) Patent No.: US 11,899,959 B2
(45) Date of Patent: Feb. 13, 2024

(54) METHOD OF TESTING MEMORY DEVICE, MEMORY BUILT-IN SELF TEST (MBIST) CIRCUIT, AND MEMORY DEVICE FOR REDUCING TEST TIME

(71) Applicant: SAMSUNG ELECTRONICS CO., LTD., Suwon-si (KR)

(72) Inventors: Jaewon Park, Hwaseong-si (KR); Sangkil Park, Hwaseong-si (KR); Jaehoon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 212 days.

(21) Appl. No.: 17/337,992

(22) Filed: Jun. 3, 2021

(65) Prior Publication Data

US 2022/0113889 A1 Apr. 14, 2022

(30) Foreign Application Priority Data

Oct. 13, 2020 (KR) .................. 10-2020-0131968

(51) Int. Cl.
  *G06F 3/06* (2006.01)
(52) U.S. Cl.
  CPC .......... *G06F 3/0653* (2013.01); *G06F 3/0614* (2013.01); *G06F 3/0679* (2013.01)
(58) Field of Classification Search
  None
  See application file for complete search history.

(56) References Cited

U.S. PATENT DOCUMENTS 5,809,225 A 9/1998 Ohsawa et al.
6,421,797 B1 * 7/2002 Kim .................. G11C 29/34
                                                  714/718

(Continued)

FOREIGN PATENT DOCUMENTS

CN  111063386 A  4/2020
KR  1994-0022583 A  10/1994

(Continued)

OTHER PUBLICATIONS

Communication dated Apr. 8, 2022 issued by the Taiwan Intellectual Property Office in TW Patent Application No. 110135373.

(Continued)

*Primary Examiner* — Charles Rones
*Assistant Examiner* — Jonah C Krieger
(74) *Attorney, Agent, or Firm* — Sughrue Mion, PLLC

(57) ABSTRACT

A method of testing a memory device, a memory built-in self-test (MBIST) circuit, and a memory device for improving reliability and reducing a test time. The memory device includes a plurality of memory banks and the MBIST circuit. The MBIST circuit is configured to generate double data rate (DDR) test patterns and parallel bit test (PBT) test patterns to test the memory banks. When a defective cell is detected as a result of the PBT test or the DDR test, the MBIST circuit is configured to perform a repair operation for replacing the defective cell with a redundancy cell and perform a re-test to verify the repair operation. The MBIST circuit may be configured to perform the DDR test on one or more memory cells including the defective cell during the re-test.

20 Claims, 13 Drawing Sheets

(56) References Cited

U.S. PATENT DOCUMENTS

| | | |
|---|---|---|
| 6,681,358 B1 | 1/2004 | Karimi et al. |
| 6,728,910 B1 | 4/2004 | Huang |
| 6,816,991 B2 | 11/2004 | Sanghani |
| 7,421,636 B2 | 9/2008 | Kang et al. |
| 7,747,912 B2 | 6/2010 | Byun et al. |
| 8,035,407 B2 | 10/2011 | Jarboe, Jr. et al. |
| 8,937,845 B2 | 1/2015 | Verma et al. |
| 9,436,567 B2 | 9/2016 | Gorti et al. |
| 10,614,906 B2 | 4/2020 | Ryu et al. |
| 10,692,583 B2 | 6/2020 | Shin |
| 2004/0061560 A1* | 4/2004 | Kwon .................. H03K 5/1534 331/53 |
| 2005/0257107 A1 | 11/2005 | Kim |
| 2008/0215939 A1 | 9/2008 | Ahn et al. |
| 2009/0108893 A1* | 4/2009 | Otsuka .................. G06F 30/394 716/126 |
| 2010/0254205 A1* | 10/2010 | Yamauchi .............. G11C 17/16 365/201 |
| 2019/0027230 A1* | 1/2019 | Ryu .................... G06F 11/1048 |
| 2022/0013188 A1* | 1/2022 | Kim ...................... G11C 29/14 |

FOREIGN PATENT DOCUMENTS

| | | |
|---|---|---|
| KR | 10-0532408 B1 | 11/2005 |
| KR | 10-0702300 B1 | 3/2007 |
| KR | 10-2009-0005918 A | 1/2009 |
| KR | 10-2014-0013893 A | 2/2014 |
| KR | 10-2019-0131854 A | 11/2019 |
| WO | 03/046925 A2 | 6/2003 |

OTHER PUBLICATIONS

Sridhar et al., "Built-in self-repair (BISR) technique widely Used to repair embedded random access memories (RAMSs)," International Journal of Computer Science Engineering (IJCSE), vol. 1 No. 01, Sep. 2012, pp. 42-60 (19 total pages).

Einfochips Pes, "Memory Testing: MBIST, BIRA & BISR/ An Insight into Algorithms and Self Repair Mechanism," Semiconductor, Apr. 25, 2019, (9 total pages).

* cited by examiner

|  ADDRESS STORAGE TABLE (AST) 222 ||
|---|---|
| S_ADDR | D_ADDR |
| FRA | RRA |
| FCA | RCA |

METHOD OF TESTING MEMORY DEVICE, MEMORY BUILT-IN SELF TEST (MBIST) CIRCUIT, AND MEMORY DEVICE FOR REDUCING TEST TIME

CROSS-REFERENCE TO RELATED APPLICATION

This application is based on and claims priority under 35 U.S.C. § 119 to Korean Patent Application No. 10-2020-0131968, filed on Oct. 13, 2020, in the Korean Intellectual Property Office, the disclosure of which is incorporated by reference herein in its entirety.

BACKGROUND

One or more embodiments of the disclosure relate to a semiconductor memory device, and more particularly, to a method of testing a memory device, a memory built-in self-test (MBIST) circuit, and a memory device for improving reliability and reducing test time.

Semiconductor chips are manufactured through a semiconductor manufacturing process and are tested by test equipment when they are in the state of a wafer, a die, or a package. Defects or defective chips are selected through a test, and if some memory cells fail, a repair operation is performed to rescue semiconductor chips. As semiconductor chips such as dynamic random access memories (DRAMs) continue to be downsized, the chips are more prone to errors during a manufacturing process. Also, an error may occur during a chip operation even when the error is not detected during an initial test.

A system using semiconductor chips, like a data center, is hosted by many companies and their computer systems. The data center is used to distribute hosted applications and/or transactions and includes networked computer resources (e.g., servers, disks, virtual machines, etc.) that are often referred to as clouds. In this configuration, companies are clients of the data center. Data centers offer clients a number of advantages, including reduced cost, easy expansion, and reduced management load. The data center widely uses DRAM as an operating memory or a main memory of a system and uses a storage device including a non-volatile memory as a storage medium, in order to store data or instructions used by hosts in the data center and/or to perform computational operations.

A high-capacity DRAM is required by a data center for stable and fast real-time processing of large amounts of data. However, the performance quality of a DRAM may change over time. For example, when an application and/or a transaction is allocated and uses a certain space in a memory, a page fault may occur due to a faulty memory. When such a page fault occurs frequently, the normal flow of execution of instructions may be disrupted, and thus there may be availability constraints of a data center, such as aborting and restarting a started operation.

Therefore, the importance of testing a DRAM while the DRAM is installed and operating in a system is increasing. Also, because a faulty cell may be repaired when a DRAM cell failure occurs as a result of a system-level test, it may facilitate improvement of performance and reliability of a DRAM. Also, a test time of a high-capacity DRAM may be reduced, so as to prevent interference with system performance.

SUMMARY

One or more embodiments of the disclosure provide a method of testing a memory device, a memory built-in self-test (MBIST) circuit, and a memory device for improving reliability and reducing test time.

According to an embodiment, there is provided a method of testing a memory device including a plurality of memory banks and a memory built-in self-test (MBIST) circuit, wherein the plurality of memory banks include a plurality of memory cells, and the MBIST circuit performs a double data rate (DDR) test or a parallel bit test (PBT). The method includes: setting an MBIST option, the MBIST option including a DDR test mode and a PBT test mode; based on the PBT test mode being set as the MBIST option, performing the PBT test on the plurality of memory banks; based on the DDR test mode being set as the MBIST option, performing the DDR test on one bank selected from among the plurality of memory banks; based on detecting a defective cell as a result of the DDR test or the PBT test, performing a repair operation for repairing the defective cell with a redundancy cell through the MBIST circuit; and performing a re-test for verifying the repair operation through the MBIST circuit, wherein the re-test is performed on one or more memory cells including the defective cell among the plurality of memory cells.

The method further includes generating an internal clock signal having a highest frequency used in an operation for testing the memory device, wherein the MBIST circuit is configured to perform the PBT test or the DDR test by using the internal clock signal.

The method further includes providing information regarding the defective cell to a memory controller connected to the memory device through the MBIST circuit, wherein the defective cell is detected based on a comparison of a logic state output from each of the plurality of memory cells in response to same write data input to each of the plurality of memory cells.

The MBIST option further includes an MBIST repair option for repairing the defective cell and an MBIST auto repair option for automatically repairing the defective cell.

In the setting of the MBIST option, the MBIST option is set in a mode register or a test mode register of the memory device.

In the setting of the MBIST option, the MBIST option is set using a test interface standard.

The performing of the PBT test includes: generating a plurality of PBT patterns by a test pattern generation (TPG) circuit of the MBIST circuit; executing the PBT test on the plurality of memory banks by using patterns in an enable state from among the plurality of PBT patterns; and not executing the PBT test on the plurality of memory banks by using the patterns in a disable state from among the plurality of PBT patterns.

The performing of the DDR test includes: generating a plurality of DDR patterns by a test pattern generation (TPG) circuit of the MBIST circuit; executing the DDR test for a selected one memory bank by using patterns in an enable state from among the plurality of DDR patterns; and not executing the DDR test on the selected one memory bank by using patterns in a disable state from among a plurality of PBT patterns.

The performing of the repair operation for repairing the defective cell with the redundancy cell through the MBIST circuit includes: outputting a fail flag signal indicating that the defective cell has been detected; outputting a fail cell address of the defective cell; repairing each of a fail row address or a fail column address included in the fail cell address with a redundancy row address or a redundancy column address in response to the fail flag signal; and storing the fail row address, the fail column address, the redundancy row address corresponding to the fail row address, and the redundancy column address corresponding to the fail column address in an address storage table (AST).

The method further includes providing information regarding the AST to a memory controller connected to the memory device.

In the performing of the re-test for verifying the repair operation through the MBIST circuit, the DDR test is performed on the defective cell.

In the performing of the re-test for verifying the repair operation through the MBIST circuit, the DDR test is performed on the one or more memory cells including the defective cell.

In the performing of the re-test for verifying the repair operation through the MBIST circuit, the PBT test is performed on all of the plurality of memory cells of the plurality of memory banks.

The method further includes testing, by the MBIST circuit, architectural requirements of a memory physical layer (PHY) included in a memory controller connected to the memory device by using a result of the DDR test.

The architecture requirements of the memory PHY includes DC parameters including voltage levels and rise times and fall times of input/output signals provided to signal lines connected to the memory PHY and AC parameters including a memory access time, and setup times and hold times for the input/output signals.

According to an embodiment, there is provided a memory built-in self-test (MBIST) circuit for testing a memory device including a plurality of memory banks. The MBIST circuit includes: a test pattern generating (TPG) circuit configured to generate a plurality of test patterns, the plurality of test patterns including a double data rate (DDR) test pattern and a parallel bit test (PBT) test pattern; a built-in redundancy analysis (BIRA) circuit configured to perform a repair operation for replacing a defective cell detected in a PBT test or a DDR test on the memory device with a redundancy cell, and store information regarding a fail cell address and a redundancy cell address in an address storage table (AST); and a built-in self-repair (BISR) control circuit configured to output BISR signals to perform the repair operation in response to a fail flag signal indicating that the defective cell has been detected, wherein the TPG circuit is further configured to perform a re-test on one or more memory cells including the defective cell among a plurality of memory cells to verify the repair operation through the BIRA circuit.

The MBIST circuit is further configured to receive an internal clock signal having a highest frequency used for an operation for testing the memory device and perform the PBT test or the DDR test by using the internal clock signal.

The MBIST circuit is further configured to provide information regarding the defective cell to a memory controller connected to the memory device, wherein the defective cell is detected based on a comparison of a logic state output from each of the plurality of memory cells in response to same write data input to each of the plurality of memory cells.

The BIRA circuit is further configured to output information regarding the AST to a memory controller outside the memory device.

The TPG circuit is further configured to perform the DDR test on the one or more memory cells including the defective cell among the plurality of memory cells during the re-test.

The TPG circuit is further configured to perform the PBT test on all of the plurality of memory cells of the plurality of memory banks during the re-test.

The MBIST circuit further includes: an input/output path test circuit configured to test architectural requirements of a memory physical layer (PHY) included in a memory controller connected to the memory device by using a result of the DDR test, wherein the architecture requirements of the memory PHY include DC parameters including voltage levels and rise times and fall times of input/output signals provided to signal lines connected to the memory PHY and AC parameters including a memory access time, and setup times and hold times for the input/output signals.

According to an embodiment, there is provided a memory device including: a plurality of memory banks including a plurality of memory cells; a control circuit configured to control an operation of the memory device, wherein the control circuit includes a mode register that provides operational options of the memory device, and a test mode register that provides test mode options including a parallel bit test (PBT) test mode and a double data rate (DDR) test mode; and a memory built-in self-test (MBIST) circuit configured to test the plurality of memory banks in the DDR test mode or the PBT test mode, wherein the MBIST circuit is further configured to perform a repair operation for replacing a defective cell detected in the PBT test or the DDR test with a redundancy cell, and perform a re-test on one or more memory cells including the defective cell among the plurality of memory cells to verify the repair operation.

The memory device further includes a clock generator configured to generate an internal clock signal having a highest frequency used in an operation for testing the memory device, wherein the internal clock signal has a clock frequency higher than that of an external clock signal applied to the memory device, the external clock signal is used in a normal DDR mode of the memory device, and the internal clock signal is used in the PBT test mode or the DDR test mode.

The MBIST circuit further includes a test pattern generation (TPG) circuit configured to generate a plurality of test patterns, wherein the plurality of test patterns include a DDR test pattern and a PBT test pattern.

The TPG circuit is further configured to perform the DDR test on the one or more memory cells including the defective cell, among the plurality of memory cells, by using the DDR test pattern during the re-test.

The TPG circuit is further configured to perform the PBT test on all of the plurality of memory cells of the plurality of memory banks by using the PBT test pattern during the re-test.

The memory device further includes a built-in self-repair (BISR) control circuit configured to output BISR signals to perform the repair operation in response to a fail flag signal indicating that the defective cell has been detected, wherein the defective cell is detected based on a comparison of a logic state output from each of the plurality of memory cells in response to same write data input to each of the plurality of memory cells.

The memory device further includes a built-in redundancy analysis (BIRA) circuit configured to: perform the repair operation and store information regarding a fail cell address and a redundancy cell address in an address storage table (AST); and output information regarding the AST to a memory controller outside the memory device.

The memory device further includes an input/output path test circuit configured to test architectural requirements of a memory physical layer (PHY) included in a memory controller connected to the memory device by using a result of the DDR test, wherein the architecture requirements of the memory PHY include DC parameters including voltage levels and rise times and fall times of input/output signals provided to signal lines connected to the memory PHY and AC parameters including a memory access time, and setup times and hold times for the input/output signals.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
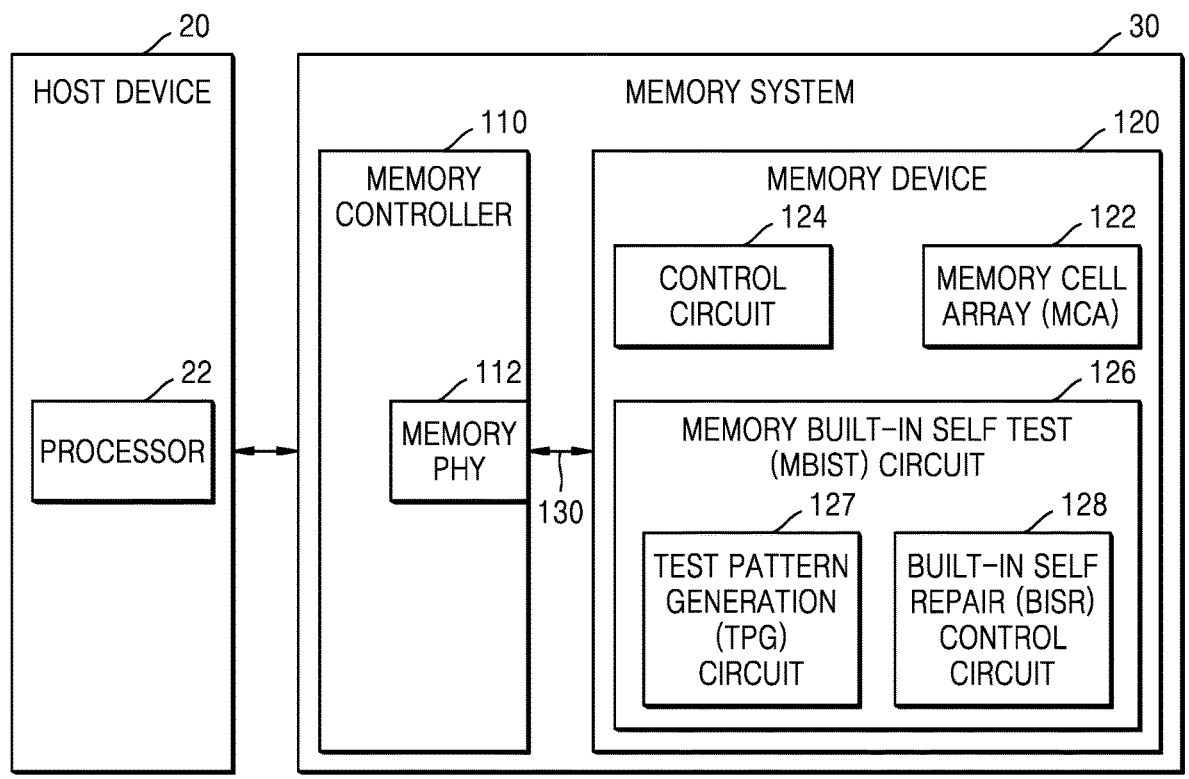
FIG. 1 is a block diagram showing a system according to an embodiment.

FIG. 1 is a block diagram showing a system according to an embodiment.

Referring to FIG. 1, a system 10 may be a data center including dozens of host machines or servers for performing hundreds of virtual machines. According to some embodiments, the system 10 may be, for example, a computing device, such as a laptop computer, a desktop computer, a server computer, a workstation, a portable communication terminal, a personal digital assistant (PDA), a portable multimedia player (PMP), a smart phone, or any other suitable computers, a VM, or a virtual computing device thereof. In addition, the system 10 may be a component included in a computing system (e.g., a graphics card).

Although various hardware components of the system 10 to be described below are shown in FIG. 1, the inventive concept is not limited thereto, and other components may be included. The system 10 may include a host device 20 and a memory system 30. The host device 20 and the memory system 30 may be connected to each other according to various standard interfaces, e.g., Peripheral Component Interconnect-Express (PCI-E), Advanced Technology Attachment (ATA), Serial ATA (SATA), Parallel ATA (PATA), or serial attached SCSI (SAS). Furthermore, various other interface protocols, such as Universal Serial Bus (USB), Universal Flash Storage (UFS), Multi-Media Card (MMC), Enhanced Small Disk Interface (ESDI), or Integrated Drive Electronics (IDE) may be applied to the protocol between the host device 20 and the memory system 30.

The host device 20 may include a processor 22 that may be configured to execute an operating system (OS) and/or various applications. The processor 22 may be communicatively connected to the memory system 30. The memory system 30 connected to the processor 22 may be referred to as a system memory. Some examples may be described by using the expressions "connected" and/or "coupled" together with their derivatives. These terms are not necessarily intended as synonyms for each other. For example, descriptions using the terms "connected" and/or "coupled" may indicate that two or more elements are in direct physical or electrical contact with each other. In addition, the terms "connected" and/or "coupled" may also mean that two or more elements are not in direct contact with each other but still cooperate or interact with each other.

The processor 22 may be configured to perform computer operations in the system 10 and may be an arbitrary type of processor like a central processing unit (CPU), a digital signal processor (DSP), a network processor, an application processor (AP), or any other device for executing codes. The processor 22 may be configured to execute instructions, software, firmware, or combinations thereof that may be executed by one or more machines. The processor 22 may include any number of processor cores. For example, the processor 22 may include a single-core or a multi-core like dual-core, quad-core, and hexa-core. Although FIG. 1 shows the system 10 including one processor 22, according to an embodiment, the system 10 may include a plurality of processors.

The processor 22 may execute software in a virtualized environment. In the host device 20, a virtual machine may include an application (APP) and an OS. Since the application APP uses a virtual address space, a virtual address, that is, an address that may be used by software is used. The OS in each virtual machine may control a time point at which a particular application APP accesses a given memory device 120 and may control addresses that are accessed by the application APP to at least a certain degree. The OS in the virtual machine may perform and manage mapping between virtual addresses (VA) and physical addresses (PA). Physical addresses PA generated by the OS are system physical addresses PA (i.e., addresses that may be used by the memory controller 110 of a physical address space throughout the memory device 120 of the actual memory system 30. The OS may perform address translation (e.g., address mapping) between virtual addresses VA and system physical addresses PA.

The memory system 30 may include the memory controller 110, the memory device 120, and a memory interface 130. The memory controller 110 may control a memory access operation (e.g., a write operation or a read operation) for the memory device 120 in response to a request from the host device 20 connected to the memory system 30. The memory device 120 may be used as a working memory for recording or loading data used for an operation of the processor 22. Although FIG. 1 shows the memory system 30 including one memory device 120, according to embodiments, the memory system 30 may include a plurality of memory devices.

The memory interface 130 is shown as a single signal line connecting the memory controller 110 and the memory device 120 for simplicity of illustration, but may include a plurality of signal lines for connecting the memory controller 110 and the memory device 120. The memory interface 130 includes connectors for connecting the memory controller 110 and the memory device 120. The connectors may be implemented as pins, balls, signal lines, or other hardware components. For example, a clock signal CLK, a command/address signal CMD/ADDR, data DQ, etc. may be transmitted and received between the memory controller 110 and the memory device 120 through the memory interface 130. The memory interface 130 may be implemented as one channel including a plurality of signal lines or may be implemented as a plurality of channels. The memory interface 130 may be referred to as a channel, however, the terms memory interface and channel may be used interchangeably in the disclosure.

The memory controller 110 may access the memory device 120 according to a memory request of the processor 22, and a system physical address may be provided to access the memory 120. The memory controller 110 may include a memory physical layer interface, that is, a memory PHY 112 for memory interfacing, such as selecting a row and a column corresponding to a memory cell, writing data to a memory cell, or reading written data.

The actual physical implementation of the memory PHY 112 of the memory controller 112 performing the functions provided above may be in various forms. For example, the memory controller 110 may include physical components for exchanging data with the memory device 120 and may include at least one transmitter and at least one receiver. The memory controller 110 may be implemented by one or more hardware components (e.g., analog circuits, logic circuits) and program codes of software and/or firmware. The memory controller 110 may be commonly integrated into one or more processors 22, such that the memory device 120 may be consistently accessed by the one or more processors 22.

The memory device 120 may be a DRAM device. In the disclosure, the terms memory device and DRAM may be used interchangeably. However, the inventive concept is not limited thereto, and the memory device 120 may be any one of volatile memory devices like a Synchronous DRAM (SDRAM), a Double Data Rate (DDR) SDRAM, a Low Power Double Data Rate (LPDDR) SDRAM, a Graphics Double Data Rate (GDDR) SDRAM), a DDR2 SDRAM, a DDR3 SDRAM, a DDR4 SDRAM, a DDR5 SDRAM, a Wide I/O DRAM, a High Bandwidth Memory (HBM), and a Hybrid Memory Cube (HMC). According to another embodiment, the memory device 120 may be any one of a plurality of memory devices mounted on a memory module. The memory module may be implemented as an Unbuffered Dual In-line Memory Module (UDIMM), a Registered DIMM (RDIMM), a Load Reduced DIMM (LRDIMM), a Fully Buffered DIMM (FBDIMM), a Small Outline DIMM (SODIMM), etc.

The term used in the one or more embodiments of the disclosure such as "unit" or "module" indicates a unit for processing at least one function or operation, and may be implemented in hardware, software, or in a combination of hardware and software.

The term "unit" or "module" may be implemented by a program that is stored in an addressable storage medium and executable by a processor.

For example, the term "unit" or "module" may include software components, object-oriented software components, class components and task components, processes, functions, attributes, procedures, subroutines, segments of a program code, drivers, firmware, microcode, circuitry, data, databases, data structures, tables, arrays, and/or variables.

The memory device 120 may include a memory cell array (MCA) 122, a control circuit 124, and a memory built-in self-test (MBIST) circuit 126. The MCA 122 may include a plurality of word lines, a plurality of bit lines, and a plurality of memory cells formed at points where the word lines and the bit lines intersect. The memory cells may each include a DRAM cell including one access transistor and one storage capacitor. The MCA 122 may include a plurality of memory banks, and the memory banks may each include a normal cell array and a redundancy cell array.

The control circuit 124 may control access to the MCA 122 based on commands and addresses received by the memory device 120. The control circuit 124 may control a test for the MCA 122 in connection with the MBIST circuit 126.

The MBIST circuit 126 may perform a test and repair operation for the MCA 122. The MBIST circuit 126 may include a test pattern generating (TPG) circuit 127 and a built-in self-repair (BISR) control circuit 128.

The TPG circuit 127 may provide test patterns for detecting cell failures in the MCA 122. The test patterns may include various test vectors for detecting specific faults and structural defects and have high fault coverage. For example, the test patterns may include random test patterns, pseudo-random test patterns, which are similar to the random test patterns except that test vector sequences thereof are repeated, or parallel bit test (PBT) patterns including the same data (e.g., "0" or "1").

The BISR control circuit 128 may control the MCA 122 to repair a defective cell of the MCA 122 with a redundancy cell. The TPG circuit 127 may perform a re-test on the MCA 122 to verify a repair operation. During the re-test, the TPG circuit 127 may selectively test the entire MCA 122 or some regions of the MCA 122 including defective cells.

Figure 2:
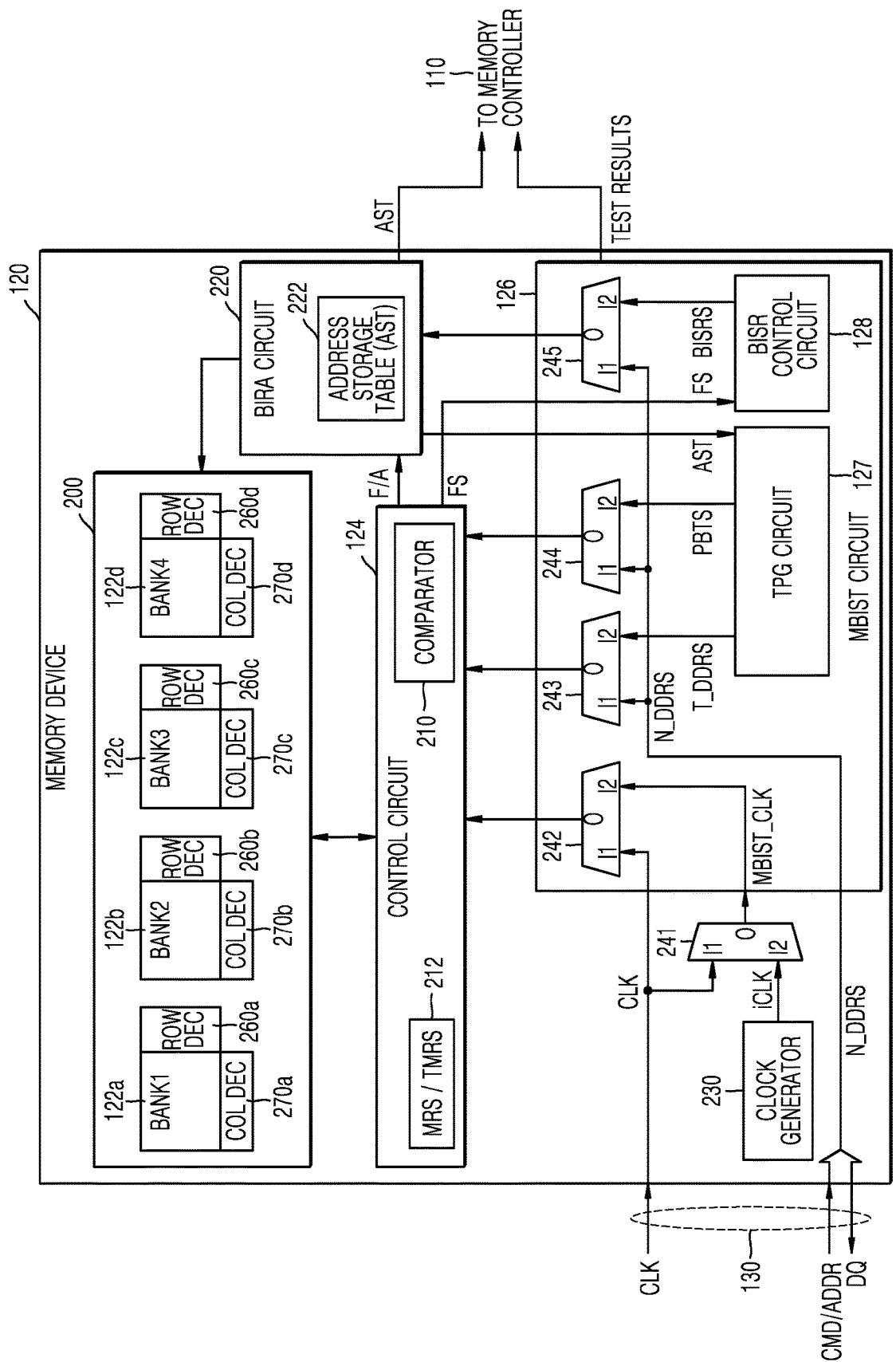
FIG. 2 is a block diagram showing a memory device in the memory system of FIG. 1, according to an embodiment.

FIG. 2 is a block diagram showing a memory device in the memory system of FIG. 1 according to an embodiment. FIG. 2 shows a number of hardware components included in the memory device 120. However, the inventive concept is not limited thereto, and other components may be provided. Hereinafter, alphabets attached to reference numbers (e.g., 122a, 260a, 270a, etc.) are used to identify a plurality of circuits having the same function.

Referring to FIGS. 1 and 2, the memory device 120 may include a memory core 200, a control circuit 124, an MBIST circuit 126, a built-in redundancy analysis (BIRA) circuit 220, and a clock generator 230.

The memory core 200 may include first to fourth bank arrays 122a, 122b, 122c, and 122d. The first to fourth bank arrays 122a, 122b, 122c, and 122d may correspond to the memory cell array 122 of FIG. 1. First to fourth bank row decoders 260a, 260b, 260c, and 260d and first to fourth bank column decoders 270a, 270b, 270c, and 270d may be connected to the first to fourth bank arrays 122a, 122b, 122c, and 122d, respectively. The memory core 200 may include first to fourth bank sense amps respectively connected to the first to fourth bank arrays 122a, 122b, 122c, and 122d. The first to fourth bank arrays 122a, 122b, 122c, and 122d, the first to fourth bank row decoders 260a, 260b, 260c, and 260d, the first to fourth bank column decoders 270a, 270b, 270c, and 270d, and the first to fourth bank sense amps may constitute first to fourth banks BANK1 to BANK4. Although FIG. 2 shows an example of the memory device 120 including four banks, one or more embodiments are not limited thereto, and the memory device 120 may include any number of banks.

The control circuit 124 may receive a command CMD and an address ADDR from the memory controller 110 through the memory interface 130 shown in FIG. 1. The control circuit 124 may control a normal operation, a test operation, or a refresh operation for the first to fourth banks BANK1 to BANK4 based on the command CMD and the address ADDR. The control circuit 124 may control the first to fourth bank row decoders 260a, 260b, 260c, and 260d, the first to fourth bank column decoders 270a, 270b, 270c, and 270d, the MBIST circuit 126, and the BIRA circuit 220 based on the command CMD and the address ADDR.

The BIRA circuit 220 is correlated with the BISR control circuit 128 of the MBIST circuit 126. During a test for the first to fourth banks BANK1 to BANK4, when a failure of one of the banks is detected, the BIRA circuit 220 may perform a redundancy repair procedure to repair the detected failure using a redundancy row or a redundancy column.

The control circuit 124 may control a normal mode (i.e., a read operation or a write operation) of the memory device 120 that inputs and outputs the data DQ to and from the first to fourth banks BANK1 to BANK4 based on the command CMD and the address ADDR received from the memory controller 110 through the memory interface 130. Also, the control circuit 124 may control the memory core 200 to perform an auto refresh operation for the first to fourth banks BANK1 to BANK4 in response to a refresh command received through the memory interface 130 or to perform a self-refresh operation for the first to fourth banks BANK1 to BANK4 in response to a self-refresh entering command. For convenience of explanation and conciseness of the drawing, the command CMD, the address ADDR, and the data DQ received through the memory interface 130 are indicated as normal DDR signals N_DDRS.

The control circuit 124 may include a mode register MRS providing a plurality of operational options of the memory device 120 and a test mode register TMRS providing test operational options. An MRS/TMRS 212 may program various functions, characteristics, and modes of the memory device 120. Test mode options (e.g., a DDR test mode or a PBT test mode) to be performed by the MBIST circuit 126, may be selectively set by the MRS/TMRS 212.

The control circuit 124 may include a comparator 210 that outputs a fail flag signal FS and a fail cell address F/A when a defective cell is detected during a DDR test or a PBT test by the MBIST circuit 126. The comparator 210 may be implemented as an exclusive OR (XOR) logic circuit or an exclusive NOR (XNOR) logic circuit. The fail flag signal FS may be provided to the BISR control circuit 128 of the MBIST circuit 126, and the fail cell address F/A may be stored in an address storage table (AST) 222 of the BIRA circuit 220. The address storage table AST 222 may store a fail row address FRA and/or a fail column address FCA representing the fail cell address F/A.

The clock generator 230 may generate an internal clock signal iCLK having the optimal frequency used in a test operation for the memory device 120. The internal clock signal iCLK may be provided to the first selector 241. The first selector 241 may be implemented as a multiplexer receiving the clock signal CLK as a first input I1 from the memory interface 130 and the internal clock signal iCLK signal as a second input I2 from the clock generator 230, and outputting an output O based on the first input I1 and the second input I2. The clock signal CLK may be referred to as "an external clock signal CLK" to be distinguished from the internal clock signal iCLK. In the disclosure, the terms the clock signal CLK and the external clock signal CLK may be used interchangeably.

The external clock signal CLK has an operating frequency when the memory device 120 is in a normal mode, e.g., a DDR mode. The internal clock signal iCLK may have a higher clock frequency than the external clock signal CLK. When the memory device 120 is in the normal mode, the first selector 241 may select the external clock signal CLK of the first input I1 and output the same to an output O. At this time, the MBIST circuit 126 is disabled. When the memory device 120 is in a test mode, the first selector 241 may select the internal clock signal iCLK of the second input I2 and output the same to the output O. The output O of the first selector 241 may be provided to the MBIST circuit 126 as an MBIST clock signal BIST_CLK. Since the MBIST circuit 126 tests the memory device 120 using the MBIST clock signal MBIST_CLK having a high clock frequency, a time elapsed for a test may be reduced.

In the MBIST circuit 126, the TPG circuit 127 may provide various test patterns when the memory device 120 is in the test mode. The TPG circuit 127 may output DDR test signals T_DDRS including a test pattern suitable for a DDR test. Also, the TPG circuit 127 may output PBT signals PBTS including a test pattern suitable for a PBT test.

In the MBIST circuit 126, the BISR control circuit 128 may receive the fail flag signal FS output from the comparator 210 of the control circuit 124. In response to the fail flag signal FS indicating that a defective cell has been detected, the BISR control circuit 128 may output BISR signals BISRS that instruct the BIRA circuit 220 to perform a redundancy repair procedure for repairing the defective cell using a redundancy row or redundancy column.

The BIRA circuit 220 may perform a repair operation based on the BISR signals BISRS and replace the fail row address FRA and/or the fail column address FCA stored in the AST 222 with a redundancy row address RRA and/or a redundancy column address RCA, respectively. During the repair operation, the BIRA circuit 220 may store information regarding source addresses S_ADDR indicating the fail row address FRA and/or the fail column address FCA of one or more banks that needed to be repaired and destination addresses D_ADDR indicating the redundancy row address RRA and/or the redundancy column address RCA in the AST 222.

In this embodiment, it is illustrated that the BIRA circuit 220 is implemented separately from the MBIST circuit 126. However, the embodiment is not limited thereto, and the BIRA circuit 220 may be included in the MBIST circuit 126.

The BIRA circuit 220 may provide information regarding the AST 222 to the memory controller 110. The memory controller 110 may store information regarding the AST 222 as memory management information for consistent access of the memory device 120 by the one or more processors 22. The information regarding the AST 222 may be shared with the one or more processors 22. When the one or more processors 22 performs an operation for memory allocation during execution of applications, the one or more processors 22 may perform the memory allocation operation based on the information regarding the AST 222. Therefore, the one or more processors 22 may perform functions commonly known as those of a memory manager, that is, managing an address space of an OS in the memory device 120 and evenly distributing memory regions to other virtual machines using the memory device 120, by using memory management information.

Also, the BIRA circuit 220 may provide the information regarding the AST 222 to the TPG circuit 127. The TPG circuit 127 may perform a re-test on the first to fourth banks BANK1 to BANK4 to verify a repair operation by the BIRA circuit 220 based on the information regarding the AST 222. During the re-test, the TPG circuit 127 may selectively test all of the first to fourth banks BANK1 to BANK4 or some regions thereof including defective cells.

The MBIST circuit 126 may include second to fifth selectors 242, 243, 244, and 245 that control test modes and test sequences of the memory device 120. The second to fifth selectors 242, 243, 244, and 245 may be implemented as multiplexers. A second selector 242 may receive the external clock signal CLK as a first input I1 and an MBIST clock signal MBIST_CLK as a second input I2, and output an output O. When the memory device 120 is in the normal mode, the second selector 242 may select the external clock signal CLK of the first input I1 and output the same to an output O. When the memory device 120 is in a test mode by the MBIST circuit 126, the second selector 242 may select the MBIST clock signal MBIST_CLK of the second input I2 and output the same to the output O. The output O of the second selector 242 may be provided to the control circuit 124. The control circuit 124 may control a normal mode operation of the memory device 120 based on the external clock signal CLK and may control a test of the memory device 120 based on the MBIST clock signal MBIST_CLK.

A third selector 243 may receive the normal DDR signals N_DDRS as a first input I1 and the DDR test signals T_DDRS as a second input I2, and output an output O based on the first input I1 and the second input I2. When the memory device 120 is in the normal mode, the third selector 243 may select the normal DDR signals N_DDRS of the first input I1 and output the same to an output O. When the memory device 120 is in the DDR test mode by the MBIST circuit 126, the third selector 243 may select the DDR test signals T_DDRS of the second input I2 and output the same to the output O. The output O of the third selector 243 may be provided to the control circuit 124. The control circuit 124 may control a normal mode operation of the memory device 120 based on the normal DDR signal N_DDRS and may control a test of the memory device 120 based on the DDR test signal T_DDRS.

A fourth selector 244 may receive the normal DDR signal N_DDRS as a first input I1 and the PBT signals PBTS as a second input I2, and output an output O. When the memory device 120 is in the normal mode, the fourth selector 244 may select the normal DDR signals N_DDRS of the first input I1 and output the same to an output O. When the memory device 120 is in the PBT test mode by the MBIST circuit 126, the fourth selector 244 may select the PBT signal PBTS of the second input I2 and output the same to the output O. The output O of the fourth selector 244 may be provided to the control circuit 124. The control circuit 124 may control a normal mode operation of the memory device 120 based on the normal DDR signal N_DDRS and may control a PBT test of the memory device 120 based on the PBT signals PBTS.

The MBIST circuit 126 may be configured, such that only one of the third selector 243 and the fourth selector 244 is activated according to the DDR test mode or the PBT test mode. In DDR test mode, the third selector 243 may be activated and the fourth selector 244 may be deactivated. In the PBT mode, the fourth selector 244 may be activated, and the third selector 243 may be deactivated.

A fifth selector 245 may receive the normal DDR signals N_DDRS as a first input I1 and the BISR signals BISRS as the second input I2, and output an output O based on the first input I1 and the second input I2. When the memory device 120 is in the normal mode, the fifth selector 245 may select the normal DDR signals N_DDRS of the first input I1 and output the same to an output O. When the memory device 120 is in the DDR test mode or the PBT test mode by the MBIST circuit 126, the fifth selector 245 may select the BISR signals BISRS of the second input I2 and output the same to the output O. The output O of the fifth selector 245 may be provided to the BIRA circuit 220. The BIRA circuit 220 may perform a repair operation in the normal mode of memory device 120 based on the normal DDR signals N_DDRS and may perform a repair operation in the DDR test mode or the PBT mode based on the BISR signals BISRS.

Although the present embodiment illustrates that the second to fifth selectors 242 to 245 are implemented in the MBIST circuit 126, the embodiment is not limited thereto, and at least one of the second to fifth selectors 242 to 245 may be implemented separately from the MBIST circuit 126.

The MBIST circuit 126 may provide DDR test results and/or PBT test results for the memory device 120 to the memory controller 110. The memory controller 110 may perform a memory allocation operation by referring to test results output from the MBIST circuit 126.

Figure 3:
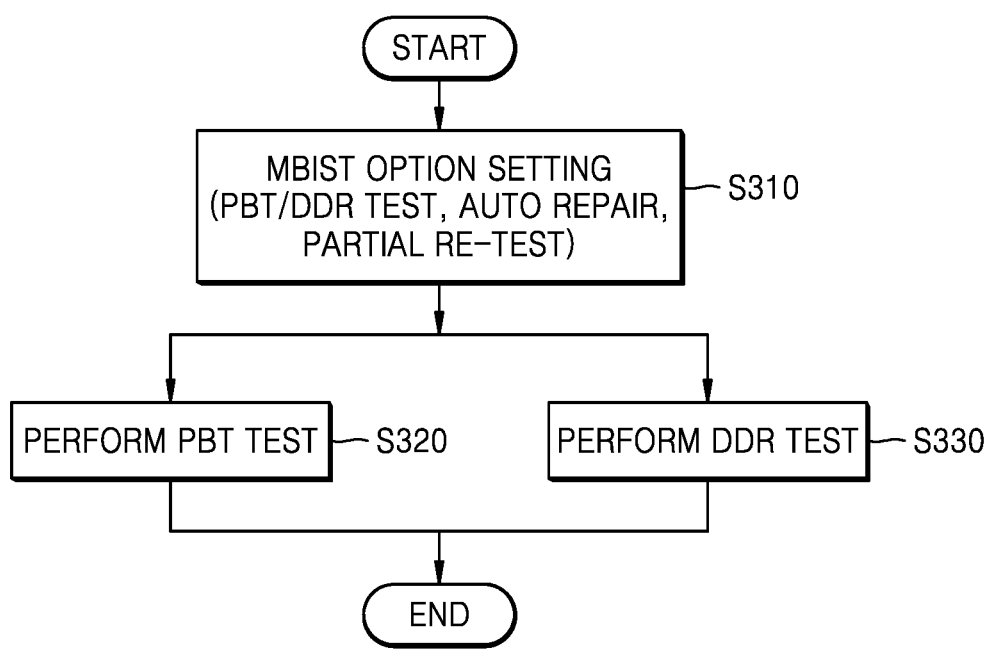
FIG. 3 is a flowchart describing a method of testing a memory device according to an embodiment.
Figure 4A:
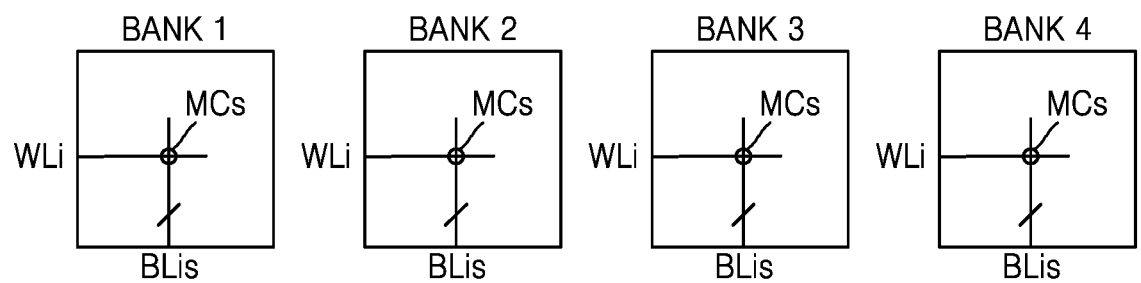
FIGS. 4A and 4B are diagrams for describing a method of testing a memory device, according to embodiments.
Figure 4B:
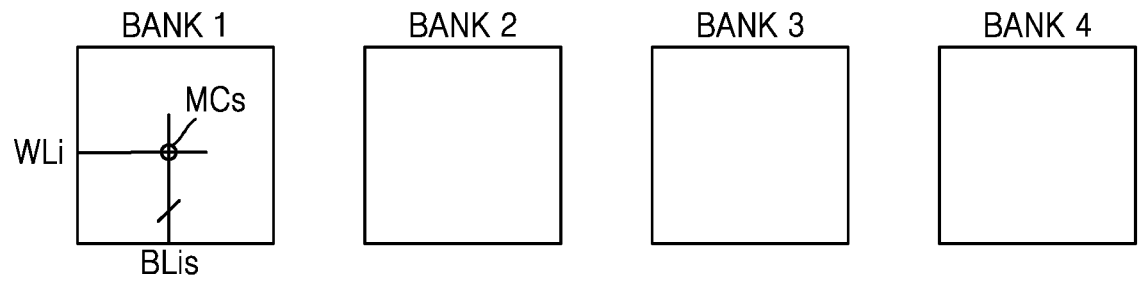

FIG. 3 is a flowchart for describing a method of testing a memory device according to an embodiment, and FIGS. 4A, and 4B are diagrams for describing a method of testing a memory device according to embodiments.

Referring to FIGS. 2 and 3, an MBIST option may be set in operation S310 and, according to set MBIST option, a PBT test may be performed by the MBIST circuit 126 in operation S320 or a DDR test may be performed by the MBIST circuit 126 in operation S330.

In operation S310, a test mode option (e.g., a PBT test mode or a DDR test mode) for a test to be performed by the MBIST circuit 126 may be set by the MRS/TMRS 212 of the memory device 120. According to embodiments, a test mode option (e.g., a DDR test mode or a PBT mode) for a test to be performed by the MBIST circuit 126 using a test interface, for example, the IEEE 1500 standard or the IEEE 1149.1 standard (or JTAG) may be set to the memory device 120.

Moreover, in operation S310, an MBIST repair option for repairing defective cell(s) obtained as a result of testing the memory device 120 by the MBIST circuit 126 may be set. Also, during repair, an MBIST auto repair option for automatically repairing by the BISR control circuit 128 and the BIRA circuit 220 may be set.

In the PBT test by the MBIST circuit 126 in operation S320, as shown in FIG. 4A, a PBT test may be performed for memory cells MCs, each MC connected to one selected word line WLi and one selected bit line BLi. Here, the number of a plurality of selected bit lines BLi's may correspond to the number of the first to fourth banks BANK1 to BANK4, which is 4. However, the one or more embodiments are not limited thereto, and the number of selected bit lines BLi's may vary according to the number of banks. In the PBT test, after writing a PBT pattern, that is, the same data (e.g., "0" or "1"), to the memory cells MCs of the first to fourth banks BANK1 to BANK4, data read out from the first to fourth banks BANK1 to BANK4 may be compared with one another in bit pairs.

In the PBT test, when data read from memory cells MCs of the first to fourth banks BANK1 to BANK4 are read in the same logic state, the comparator 210 may output, for example, a comparison signal of a logic low level. In the PBT test, when a different logic state is detected from even one of data read from memory cells MCs of the first to fourth banks BANK1 to BANK4, the comparator 210 may output, for example, a comparison signal of a logic high level. The control circuit 124 may output the fail flag signal FS indicating that a defective cell has been detected during the PBT test based on the comparison signal of the logic high level output from the comparator 210 and output the fail cell address F/A of the corresponding defective cell.

In the DDR in operation S330, as shown in FIG. 4B, a DDR test may be performed for memory cells MCs connected to one selected word line WLi and a plurality of selected bit lines BLis from one bank (e.g., a first bank BANK1) selected from among the first to fourth banks BANK1 to BANK4. In the DDR test, after writing a random test pattern provided by the TPG circuit 127 of the MBIST circuit 126 is written to the memory cells MCs of the first bank BANK1, data read out from the first bank BANK1 may be compared with the random test pattern of the TPG circuit 127.

In the DDR test, when data read from memory cells MCs of the first bank BANK1 is read in the same logic state as that of the random test pattern of the TPG circuit 127, the comparator 210 may output, for example, a comparison signal of a logic low level. In the DDR test, when a different logic state is detected from even one of piece of data read from memory cells MCs of the first bank BANK1, the comparator 210 may output, for example, a comparison signal of a logic high level. The control circuit 124 may output the fail flag signal FS indicating that a defective cell has been detected during the DDR test based on the comparison signal of the logic high level output from the comparator 210 and output the fail cell address F/A of the corresponding fail cell.

Figure 5A:
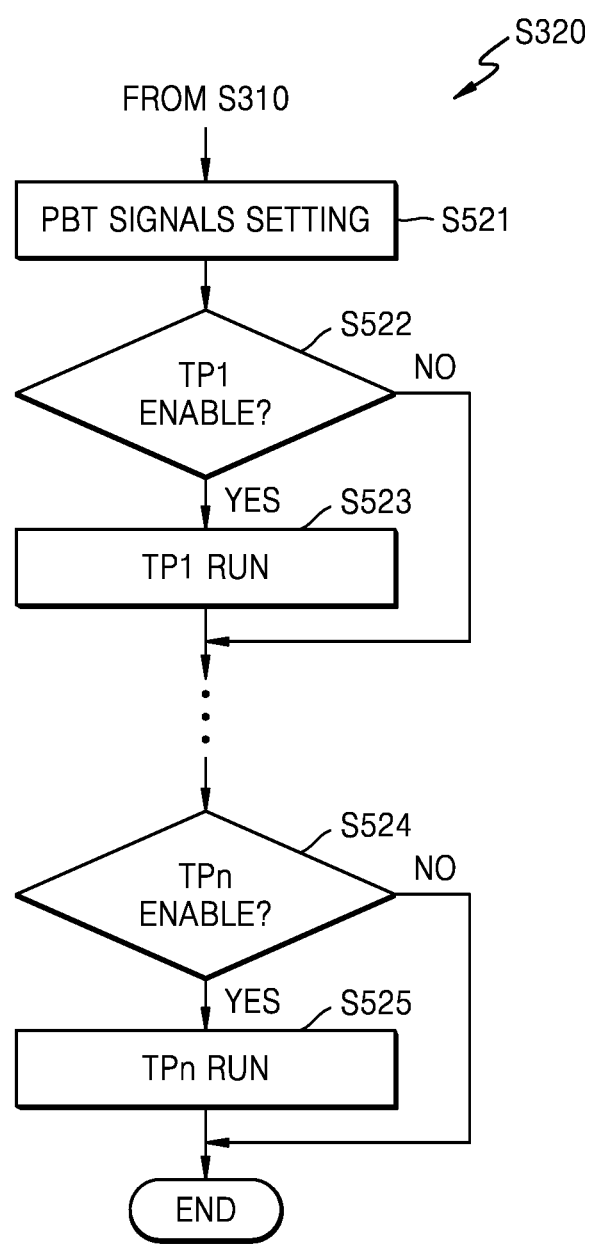
FIGS. 5A and 5B are flowcharts for describing a method of testing a memory device, according to embodiments.
Figure 5B:
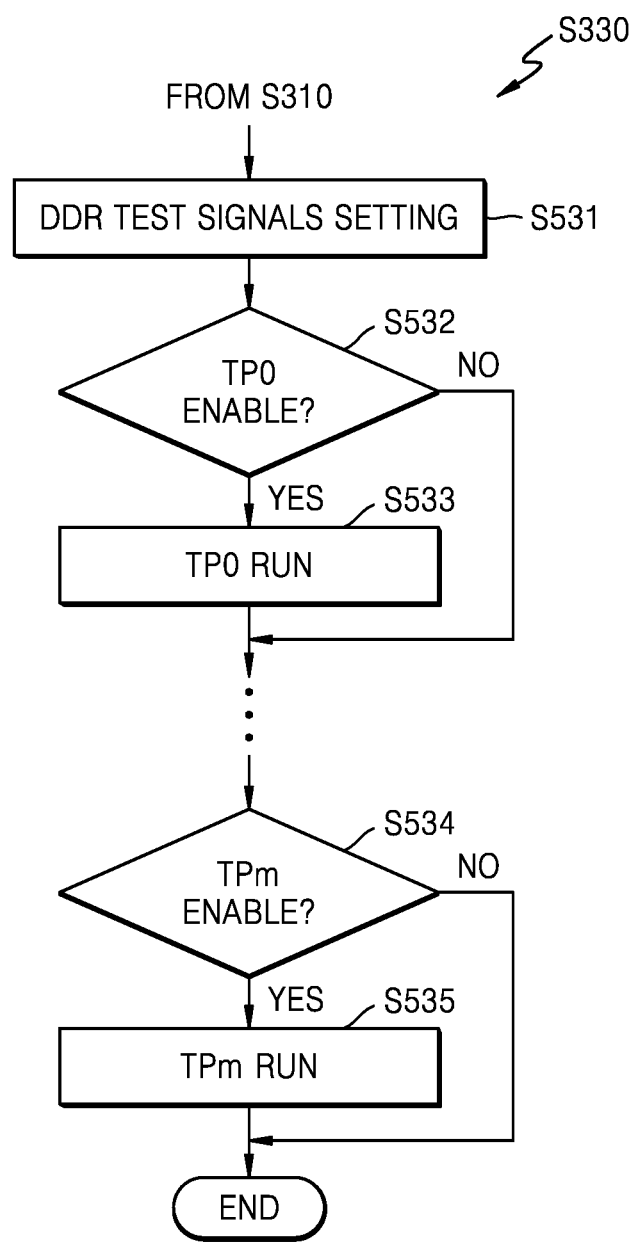

FIGS. 5A and 5B are diagrams for describing a method of testing a memory device according to embodiments.

Referring to FIGS. 2, 3, 4A, and 5A, when the test mode option for a test to be performed in the MBIST circuit 126 is set to the PBT test mode, a PBT test for the memory device 120 may be performed (operation S320).

During the PBT test in operation S320, operation S521 in which the TPG circuit 127 of the MBIST circuit 126 generates and sets PBT signals PBTS including a plurality of PBT patterns suitable for a PBT test may be performed.

In operation S522, when the operation state of a first test pattern TP1 from among the PBT patterns is enabled, a PBT test for the first to fourth banks BANK1 to BANK4 is performed using the first test pattern TP1 (operation S523). When the operation state of the first test pattern TP1 from among the PBT patterns is disabled, no test is performed, and a PBT test for a next test pattern may be performed. Similarly, a PBT test for each of the first to fourth banks BANK1 to BANK4 may be performed or not performed according to the state of each of second to n-1-th (n is a natural number) test patterns.

In operation S524, when the operation state of an n-th test pattern TPn, which is the last one of the PBT patterns, is enabled, a PBT test for the first to fourth banks BANK1 to BANK4 is performed using the n-th test pattern TPn (operation S524). When the operation state of the n-th test pattern TPn is disabled, no test is performed.

Referring to FIGS. 2, 3, 4B, and 5B, when the test mode option for a test to be performed in the MBIST circuit 126 is set to the DDR test mode, a DDR test for the memory device 120 may be performed (operation S330).

During the DDR test in operation S330, operation S531 in which the TPG circuit 127 of the MBIST circuit 126 generates and sets DDR test signals T_DDRS including a plurality of DDR test patterns suitable for a DDR test may be performed.

In operation S532, when the operation state of the first test pattern TP1 from among the DDR patterns is enabled, a DDR test for the first bank BANK1 is performed using the first test pattern TP1 (operation S533). When the operation state of the first test pattern TP1 is disable, no test is performed, and a DDR test for a next test pattern may be performed. Similarly, a DDR test for the first bank BANK1 may be performed or not performed according to the state of each of second to m-1-th (m is a natural number) test patterns.

In operation S534, when the operation state of an m-th test pattern TPm, which is the last one of the DDR patterns, is enabled, a DDR test for the first bank BANK1 is performed using the m-th test pattern TPm (operation S534). When the operation state of the m-th test pattern TPm is disabled, no test is performed. After the DDR test for the first bank BANK1 is performed, DDR tests may be continued for each of the remaining second to fourth banks BANK2 to BANK4.

Figure 6:
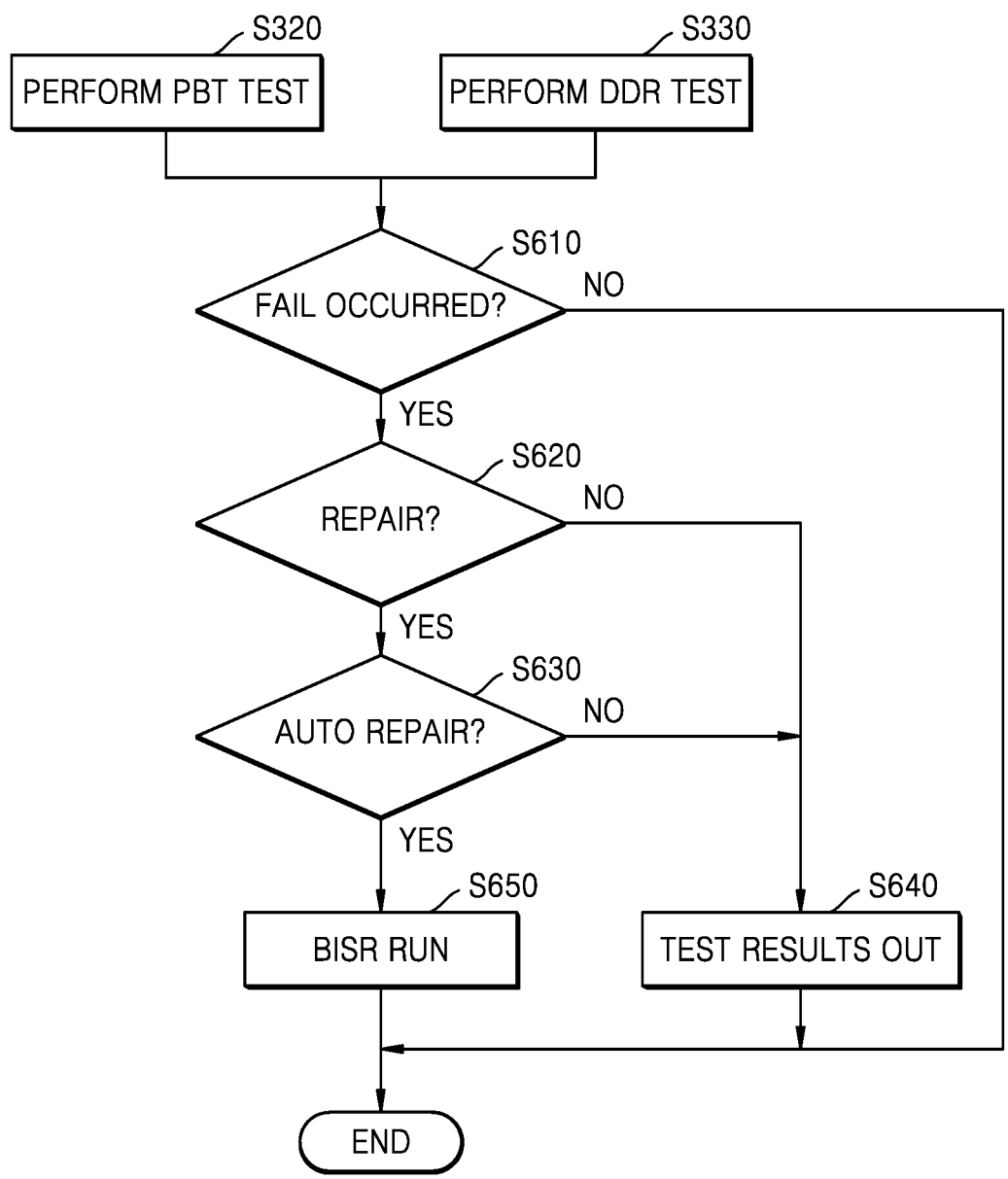
FIG. 6 is a flowchart for describing a method of testing a memory device, according to an embodiment.

FIG. 6 is a diagram for describing a method of testing a memory device according to an embodiment.

Referring to FIGS. 2, 3 and 6, a PBT test is performed for the first to fourth banks BANK1 to BANK4 (operation S320) or a DDR test is performed for each bank sequentially selected from among the first to fourth banks BANK1 to BANK4 (operation S330) according to the MBIST option of operation S310, and a fault may be detected as a result of the test (operation S610).

In operation S610, when a defective cell is detected during a DDR test or a PBT test by the MBIST circuit 126, the control circuit 124 may output the fail flag signal FS and the fail cell address F/A. The fail flag signal FS may be provided to the BISR control circuit 128 of the MBIST circuit 126, and the fail cell address F/A may be stored in an address storage table 222 of the BIRA circuit 220. In operation S610, when no fail cell is detected, an MBIST may be terminated.

In operation S620, when the MBIST repair option of operation S310 is set, the method proceeds to operation S630. Otherwise, the method proceeds to operation S640. In operation S630, when the MBIST auto repair option of operation S310 is set, a BISR operation may be performed (operation S650) and the MBIST may be terminated thereafter. In operation S630, when the MBIST auto repair option of operation S310 is not set, the test results may be output in operation S640.

In operation S640, the MBIST circuit 126 may output DDR test results and/or PBT test results for the memory device 120 to the memory controller 110 and terminate the MBIST. The memory controller 110 may perform a memory allocation operation by referring to test results output from the MBIST circuit 126. Here, the test results may include only information regarding the fail cell address F/A.

In operation S650, the BISR control circuit 128 of the MBIST circuit 126 may output BISR signals BISRS instructing the BIRA circuit 220 to perform a redundancy repair procedure for repairing a detected defective cell using a redundancy row or a redundancy column in response to the fail flag signal FS output from the control circuit 124. The BIRA circuit 220 may perform a repair operation based on the BISR signals BISRS and replace the fail row address FRA and/or the fail column address FCA stored in the AST 222 with a redundancy row address RRA and/or a redundancy column address RCA, respectively.

Figures 7, 8:
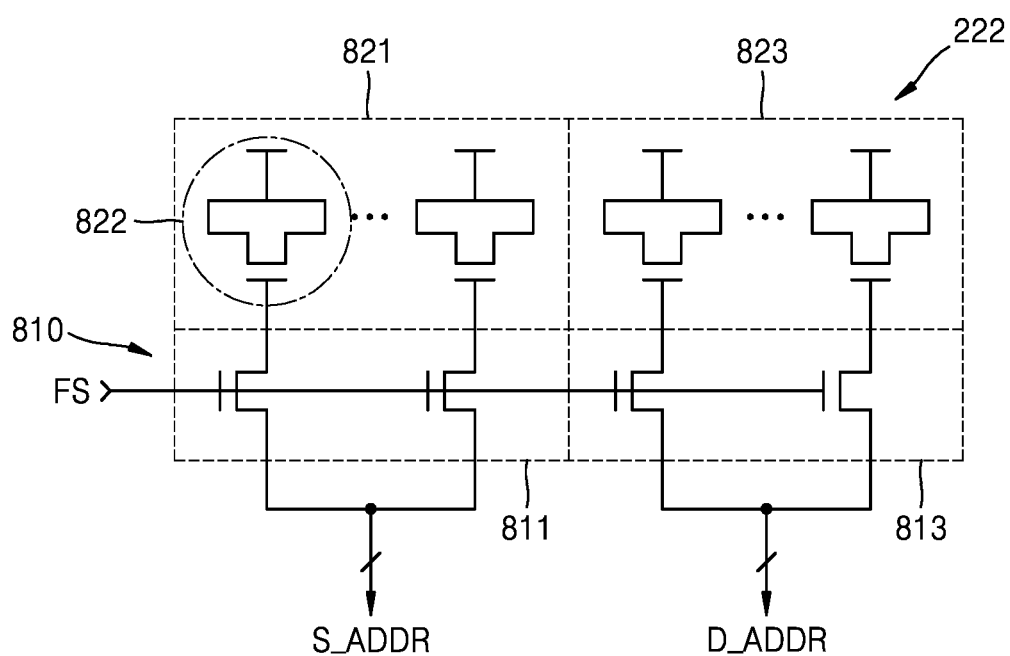
FIGS. 7 and 8 are diagrams for describing an address storage table of a built-in redundancy analysis (BIRA) circuit of FIG. 2 according to an embodiment.

FIGS. 7 and 8 are diagrams for describing an address storage table of a BIRA circuit of FIG. 2.

Referring to FIGS. 2, 6, and 7, the BIRA circuit 220 replace information regarding the fail cell address F/A provided by the control circuit 124, that is, the fail row address FRA and/or the fail column address FCA stored in the AST 222 with the redundancy row address RRA and/or the redundancy column address RCA, respectively. During a BISR operation, the BIRA circuit 220 may store information regarding source addresses S_ADDR of one or more memory cells (MCs) that needed to be repaired (e.g., the fail row address FRA and/or the fail column address FCA) and destination addresses D_ADDR including the redundancy row address RRA and/or the redundancy column address RCA in the AST 222.

Referring to FIG. 8, the AST 222 may include an anti-fuse array including one or more anti-fuses 822 and a sensing unit 810. The anti-fuse 822 is a resistive fuse element having electrical characteristics opposite to those of a fuse element, having a high resistance value in a non-programmed state, and having a low resistance value in a programmed state. The AST 222 may selectively program the one or more anti-fuses 822, thereby storing the source addresses S_ADDR in a first storage unit 821 and the destination addresses D_ADDR in a second storage unit 823. The sensing unit 810 may include first and second sub-sensing units 811 and 813 connected to first and second storage units 821 and 823, respectively. The first and second sub-sensing units 811 and 813 may include NMOS transistors. The sensing unit 810 may output information regarding the source addresses S_ADDR and the destination addresses D_ADDR in response to the fail flag signal FS.

Figure 9A:
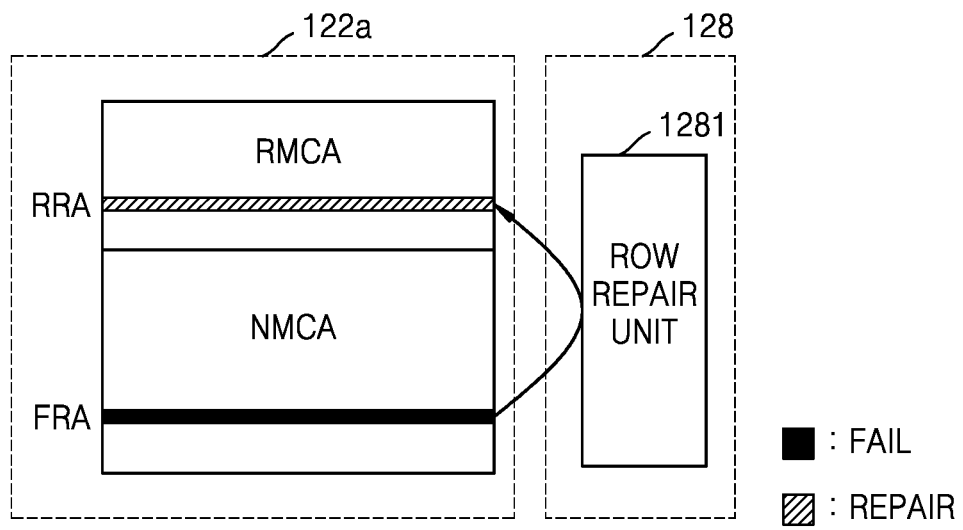
FIGS. 9A and 9B are diagrams for describing a repair operation in which a faulty cell of a memory cell array is replaced with a redundancy cell according to an embodiment.
Figure 9B:
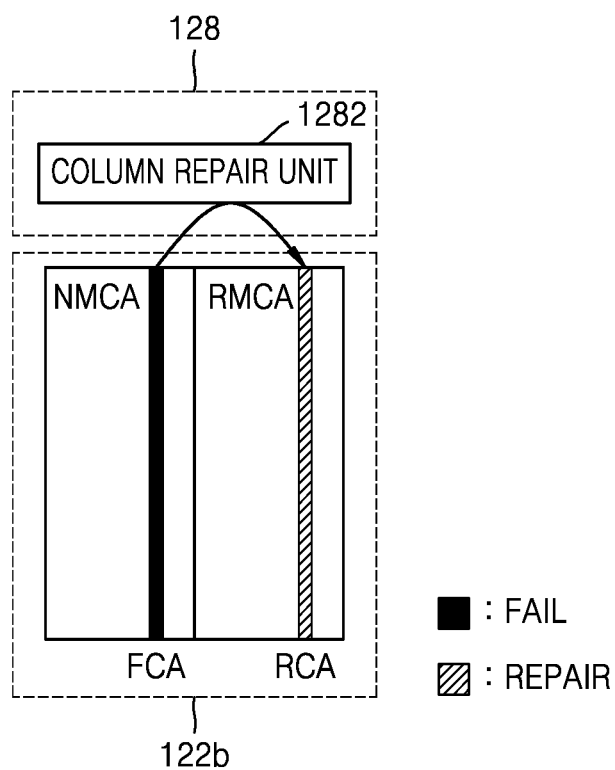

FIGS. 9A and 9B are diagrams for describing a repair operation in which a defective cell of a memory cell array is replaced with a redundancy cell.

In FIG. 9A, it is assumed that the fail row address FRA is repaired with the redundancy row address RRA. A memory cell array 122a may include a normal cell array NMCA and a redundancy cell array RMCA. The normal cell array NMCA may include memory cells connected to word lines and bit lines, and the redundancy cell array RMCA may include memory cells connected to redundancy word lines and redundancy bit lines. The BISR control circuit 128 may include a row repairer 1281 that determines the redundancy row address RRA, such that redundancy resources for repairing the fail row address FRA do not overlap with one another.

The row repairer 1281 may perform a repair operation, such that the redundancy row address RRA is selected instead of the fail row address FRA. The row repairer 1281 deactivates a word line corresponding to the fail row address FRA and activates a redundancy word line corresponding to the redundancy row address RRA instead. Therefore, redundancy cells corresponding to the redundancy row address RRA are selected instead of memory cells corresponding to the fail row address FRA.

In FIG. 9B, it is assumed that the fail column address FCA is repaired with the redundancy column address RCA. A memory cell array 122b may include the normal cell array NMCA and a redundancy cell array RMCA. The normal cell array NMCA may include memory cells connected to word lines and bit lines, and the redundancy cell array RMCA may include memory cells connected to redundancy word lines and redundancy bit lines. The BISR control circuit 128 may include a column repairer 1282 that determines the redundancy column address RCA, such that redundancy resources for repairing the fail column address FCA do not overlap with one another.

The column repairer 1282 may perform a repair operation, such that the redundancy column address RCA is selected instead of the fail column address FCA. The column repairer 1282 prevents a bit line corresponding to the fail column address FCA from being selected and selects a redundancy bit line corresponding to the redundancy column address RCA instead. Therefore, redundancy cells corresponding to the redundancy column address RCA are selected instead of memory cells corresponding to the fail column address FCA.

Figure 10:
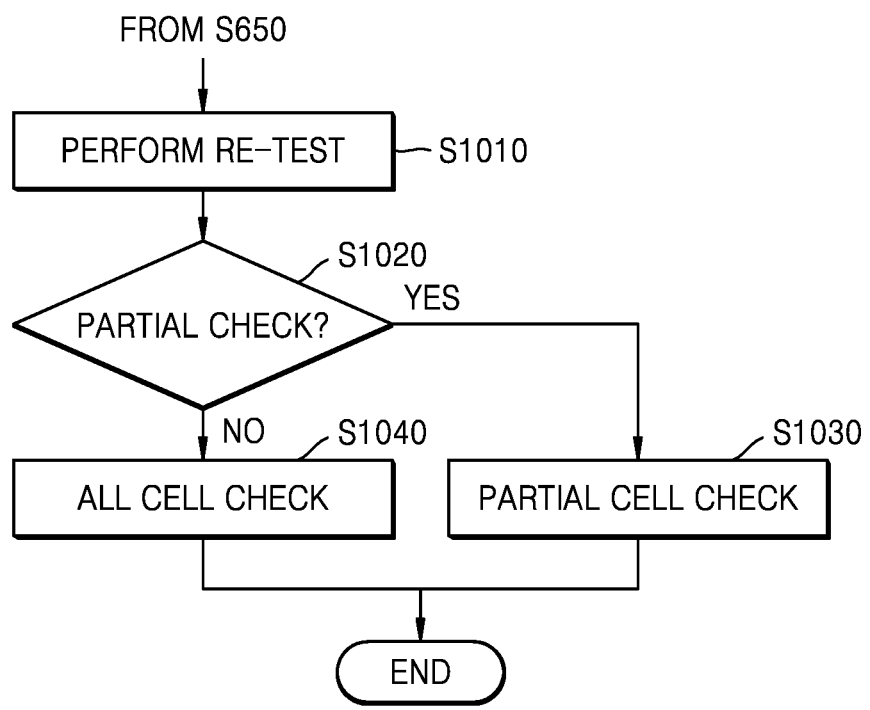
FIG. 10 is a flowchart for describing a method of testing a memory device, according to an embodiment.

FIG. 10 is a diagram for describing a method of testing a memory device according to an embodiment.

Referring to FIGS. 2, 3, 6, and 10, operation S1010 for verifying a repair operation may be performed after the BISR control circuit 128 and the BIRA circuit 220 perform the BISR in operation S650 in FIG. 6.

Referring to FIG. 10, in operation S1020, when the MBIST partial re-test option of operation S310 is set, the method proceeds to operation S1030. Otherwise, the method proceeds to operation S1040.

In operation S1030, the MBIST circuit 126 may perform a partial cell check for testing defective cells in each of the first to fourth banks BANK1 to BANK4 or some regions including defective cells. The MBIST circuit 126 may perform the partial cell check of operation S1030 in the DDR test mode.

In operation S1040, the MBIST circuit 126 may perform an all cell check for testing all of the memory cells of the first to fourth banks BANK1 to BANK4. The MBIST circuit 126 may perform the all cell check of operation S1040 in the PBT test mode.

Figure 11:
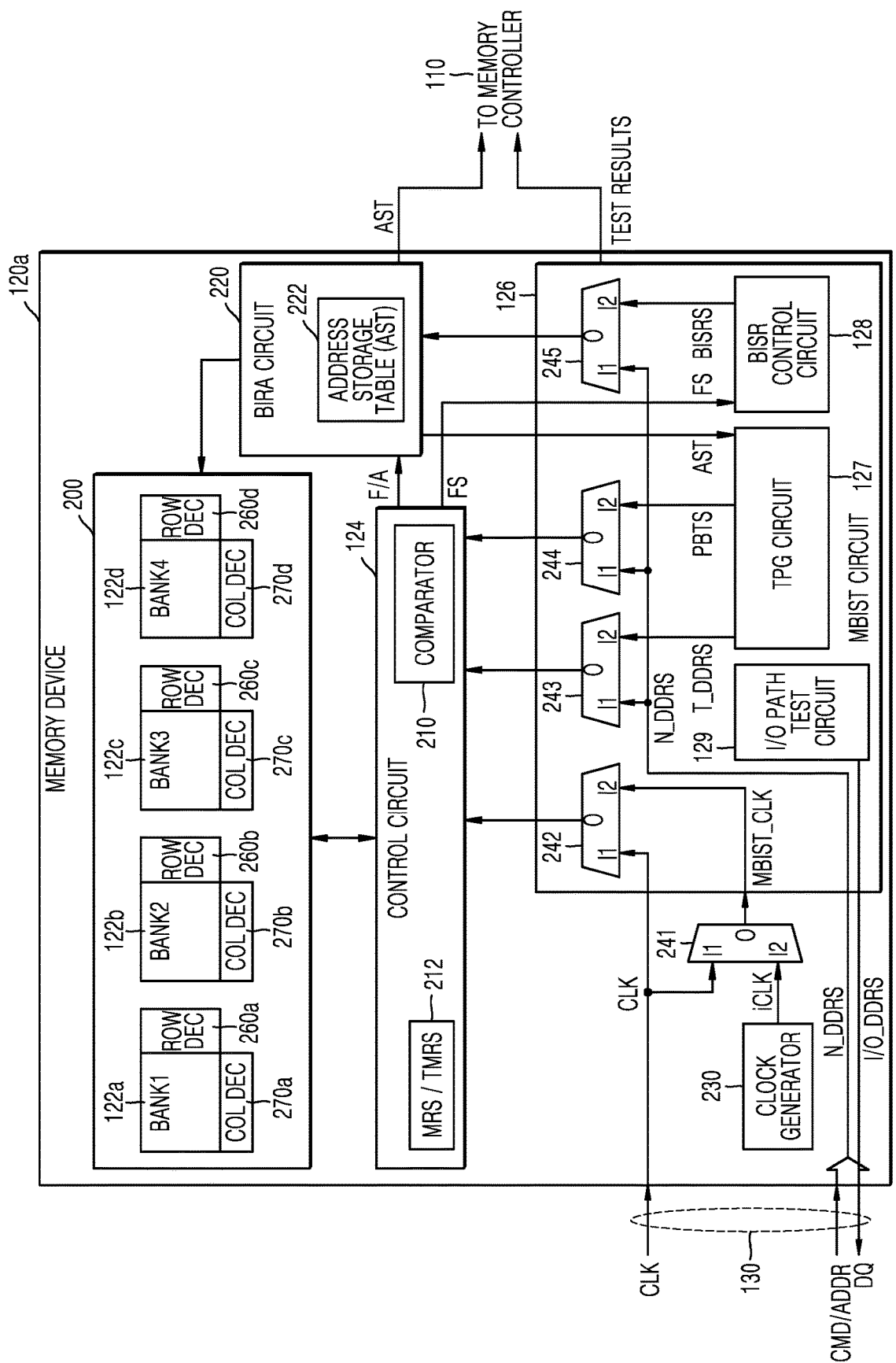
FIG. 11 is a block diagram showing a memory device in the memory system of FIG. 1, according to an embodiment.

FIG. 11 is a block diagram showing a memory device in the memory system of FIG. 1 according to another embodiment. A memory device 120a of FIG. 11 is different from the memory device 120 of FIG. 2 in that the MBIST circuit 126 further includes an input/output path test circuit 129. The above descriptions with respect to the memory device 120 of FIG. 2 may also apply to the memory device 120a of FIG. 11 within a range of not conflicting with descriptions of FIG. 11 below. Descriptions of the memory device 120a of FIG. 11 identical to those of the memory device 120 of FIG. 2 above will be omitted.

Referring to FIGS. 1 and 11, the MBIST circuit 126 may test a memory interfacing of physical layers interconnected between the memory device 120a and the memory controller 110. The MBIST circuit 126 may include an input/output path test circuit 129 that tests an input/output path including signal lines connecting between pins of the memory interface 130. DDR input/output signals I/O_DDRS for transmitting unidirectional single-signal information or bidirectional data transmission may be transmitted and received through the signal lines.

The input/output path test circuit 129 may provide a DDR test result regarding the memory device 120 as the DDR input/output signals I/O_DDRS. The input/output path test circuit 129 may test architectural requirements of the memory PHY 112 using the DDR input/output signals I/O_DDRS. The architectural requirements of the memory PHY 112 may include DC parameters, such as voltage levels and rise times and fall times of input/output signals, etc. and AC parameters, such as a memory access time, a setup time and a hold time for the input/output signals, etc.

Figure 12:
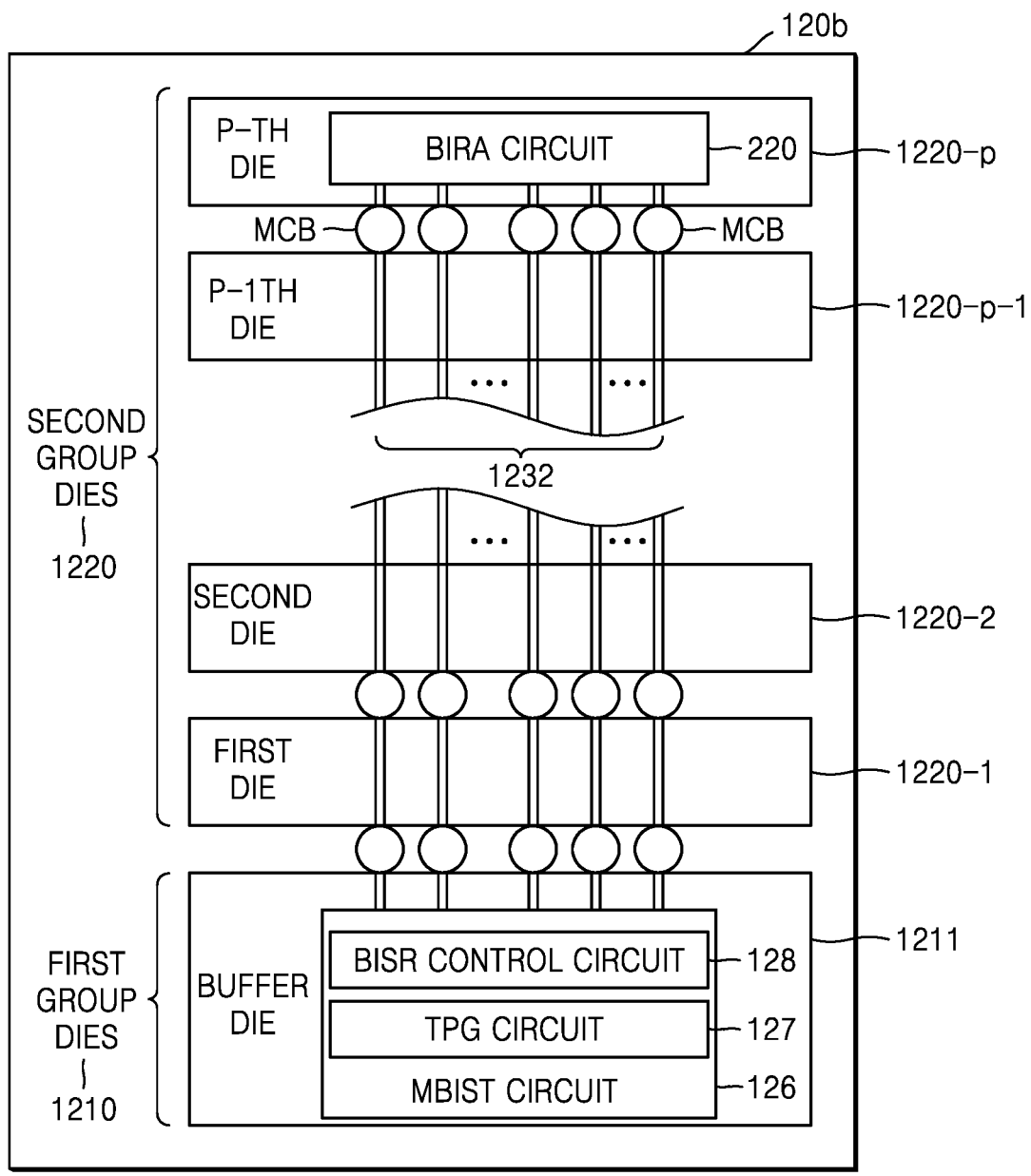
FIG. 12 is a block diagram showing a memory device according to an embodiment.

FIG. 12 is a block diagram showing an example of a memory device according to an embodiment.

Referring to FIG. 12, a memory device 120b may include a first group die 1210 and a second group die 1220 that provide failure analysis and repair functions using the MBIST circuit 126 in a stacked chip structure. The memory device 120b may be implemented as an HBM structure.

The first group die 1210 may include at least one buffer die 1211. The second group die 1220 is stacked on top of the first group die 1210 and may include a plurality of memory dies 1220-1, 1220-2, ..., and 1220-*p* exchanging control signals and/or data with the first group die 1210 through a plurality of through silicon via (TSV) lines 1232. The TSV lines 1232 may be electrically connected to micro bumps MCB formed between the memory dies 1220-1, 1220-2, ..., and 1220-*p*. At least one of the memory dies 1220-1, 1220-2, ..., and 1220-*p* may include a plurality of memory banks, and the memory banks may include DRAM cells each including one access transistor and one storage capacitor.

The buffer die 1211 may include the MBIST circuit 126 described above with reference to FIGS. 1 to 12. The MBIST circuit 126 may include the TPG circuit 127, which generates DDR test patterns or PBT test patterns and performs a PBT test for the memory dies 1220-1, 1220-2, ..., and 1220-*p* using the PBT test patterns or performs a DDR test for the memory dies 1220-1, 1220-2, ..., and 1220-*p* using the DDR test patterns. The MBIST circuit 126 may include the BISR control circuit 128, which outputs BISR signals instructing to perform a repair operation for replacing defective cells with redundancy cells in response to a fail flag signal indicating detection of the fail cells as a result of a PBT test or a DDR test.

The memory dies 1220-1, 1220-2, ..., and 1220-*p* may each include the BIRA circuit 220, which performs a repair operation for replacing defective cells detected in a PBT test or a DDR test for a plurality of memory banks with redundancy cells and stores information regarding fail cell addresses and redundancy cell addresses in an AST. The TPG circuit 127 may perform a re-test to verify a repair operation performed by the BIRA circuit 220 and may perform a DDR test on some memory cells including fail cells during the re-test.

Figure 13:
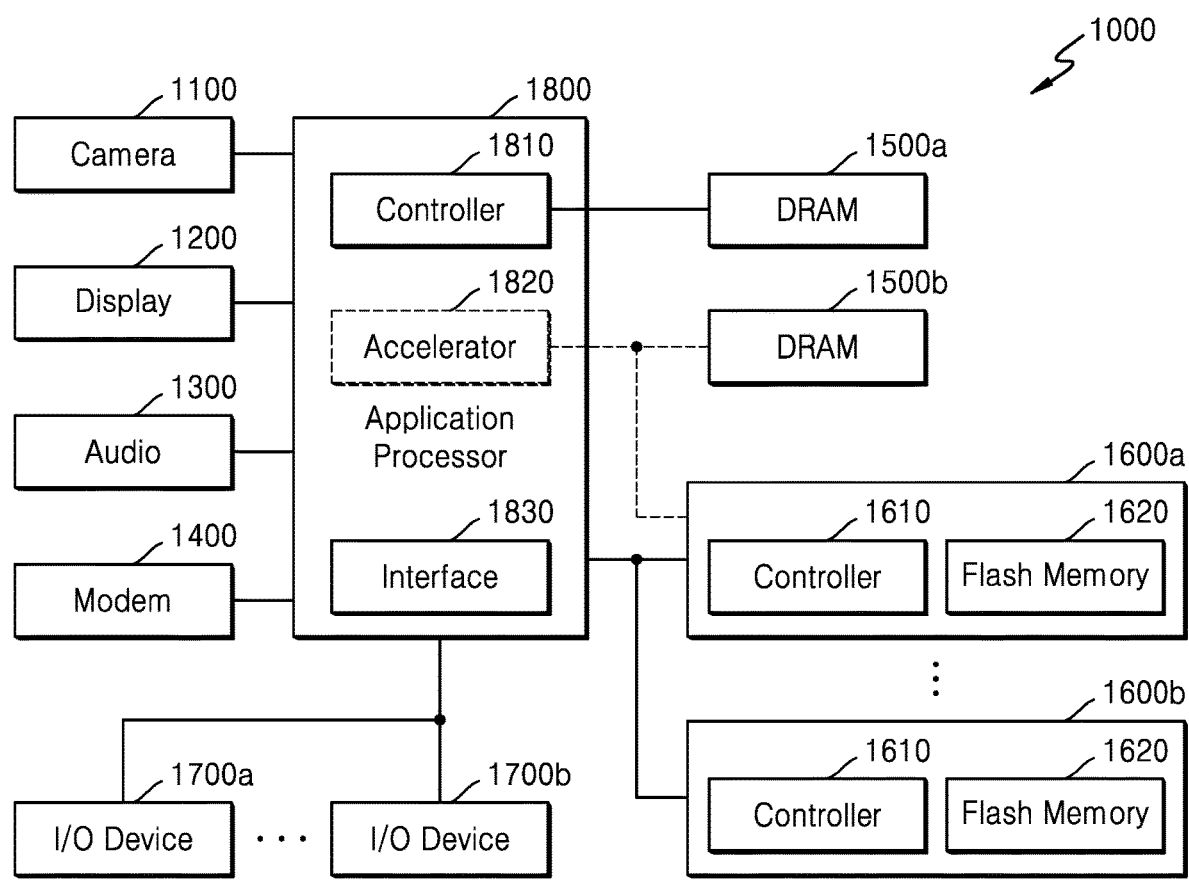
FIG. 13 is a block diagram showing a system including a memory device according to an embodiment.

FIG. 13 is a block diagram showing a system 1000 including a memory device according to an embodiment.

Referring to FIG. 13, the system 1000 may include a camera 1100, a display 1200, an audio processor 1300, a modem (1400), DRAMs 1500*a* and 1500*b*, flash memories 1600*a* and 1600*b*, I/O devices 1700*a* and 1700*b*, and an application processor (AP) 1800. The system 1000 may be implemented as a laptop computer, a mobile phone, a smart phone, a tablet personal computer (PC), a wearable device, a healthcare device, or an Internet of Things (IoT) device. Also, the system 1000 may be implemented as a server or a desktop PC.

The camera 1100 may capture a still image or a video according to a user's control and may store captured image/video data or transmit the captured image/video data to the display 1200. The audio processor 1300 may process audio data included in the flash memory devices 1600*a* and 1600*b* or network content. The modem 1400 may modulate and transmits a signal for wired/wireless data transmission/reception, and a modulated signal may be demodulated by a receiver to restore an original signal. The I/O devices 1700*a* and 1700*b* may include devices providing a digital input function and/or digital output function, e.g., a Universal Serial Bus (USB), a storage, a digital camera, a Secure Digital (SD) card, a Digital Versatile Disc (DVD), a network adapter, a touch screen, etc.

The AP 1800 may control the overall operation of the system 1000. The AP 1800 may control the display 1200, such that a part of content stored in the flash memory devices 1600*a* and 1600*b* is displayed on the display 1200. When a user input is received through the I/O devices 1700*a* and 1700*b*, the AP 1800 may perform a control operation corresponding to the user input. The AP 1800 may include an accelerator block, which is a circuit dedicated for calculation of Artificial Intelligence(AI) data, or may include an accelerator chip 1820 separately from the AP 1800. The DRAM 1500*b* may be additionally provided in the accelerator block or accelerator chip 1820. The accelerator is a function block that specializes in performing a particular function of the AP 1800 and may include a GPU, which is a function block that specializes in processing graphic data, a neural processing unit (NPU), which is a block that specializes in AI calculation and inference, and a data processing unit (DPU), which is a block that specializes in data transmission.

The system 1000 may include a plurality of DRAMs 1500*a* and 1500*b*. The AP 1800 may set up a DRAM interface protocol and communicate with the DRAMs 1500*a* and 1500*b* to control the DRAMs 1500*a* and 1500*b* through commands complying with the Joint Electron Device Engineering Council (JEDEC) standard and mode register (MRS) setting or to use company-specific functions like low voltage/high-speed/reliability and a cyclic redundancy check (CRC)/error correction code (ECC) function. For example, the AP 1800 may communicate with the DRAM 1500*a* through an interface complying with the JEDEC standards like LPDDR4 and LPDDR5, and the accelerator block or accelerator chip 1820 may set and use a new DRAM interface protocol to control the DRAM 1500*b* for an accelerator, which has a greater bandwidth than the DRAM 1500*a*.

Although FIG. 13 shows only the DRAMs 1500*a* and 1500*b*, the inventive concept is not limited thereto. As long as a bandwidth, a response speed, and voltage conditions of the AP 1800 or the accelerator chip 1820 are satisfied, any memory like a PRAM, an SRAM, an MRAM, an RRAM, an FRAM, or a Hybrid RAM may be used. The DRAMs 1500*a* and 1500*b* have relatively small latency and bandwidth than the I/O devices 1700*a* and 1700*b* or the flash memories 1600*a* and 1600*b*. The DRAMs 1500*a* and 1500*b* are initialized when the system 1000 is powered on and the OS and application data are loaded thereto, and thus the DRAMs 1500*a* and 1500*b* may be used as temporary storages for the OS and the application data or may be used as execution spaces for various software codes.

In the DRAMs 1500*a* and 1500*b*, four arithmetic operations (e.g., addition, subtraction, multiplication, and division), vector calculations, address calculations, or Fast Fourier Transform (FFT) calculations may be performed. Also, in the DRAMs 1500*a* and 1500*b*, a function for an operation used for an inference may be performed. Here, the inference may be performed in a deep learning algorithm using an artificial neural network. The deep learning algorithm may include a training operation for learning a model through various data and an inference operating for recognizing data with the trained model. According to an embodiment, an image captured by a user through the camera 1100 is signal-processed and stored in the DRAM 1500*b*, and the accelerator block or accelerator chip 1820 may perform AI data calculation for recognizing data using data stored in the DRAM 1500*b* and a function used for inference.

The DRAMs 1500*a* and 1500*b* may each include a plurality of memory banks and an MBIST circuit as described above with reference to FIGS. 1 to 12. The MBIST circuit may generate DDR test patterns or PBT test patterns, perform a PBT test for the memory banks using the PBT test patterns or perform a DDR test for the memory banks using the DDR test patterns, when a defective cell is detected as a result of the PBT test or the DDR test, perform a repair operation for replacing the fail cell with a redundancy cell, perform a re-test to verify the repair operation, and perform a DDR test for some of memory cells including a defective cell during the re-test. Also, the MBIST circuit may test the architectural requirements of a memory physical layer PHY included in a memory controller connected to the DRAMs 1500a and 1500b using a result of the DDR test.

The system 1000 may include a plurality of storages or a plurality of flash memories 1600a and 1600b having capacities larger than those of the DRAMs 1500a and 1500b. The accelerator block or accelerator chip 1820 may perform a training operation and an AI data calculation using the flash memory devices 1600a and 1600b. In an embodiment, the flash memories 1600a and 1600b may perform the training operation and the inference operation for AI data calculation, which are performed by the AP 1800 and/or the accelerator chip 1820 using a computing device provided in the memory controller 1610, more efficiently. The flash memories 1600a and 1600b may store images captured through the camera 1100 or data transmitted through a data network. For example, the flash memories 1600a and 1600b may store Augmented Reality/Virtual Reality content, High Definition (HD) content, or Ultra High Definition (UHD) content.

While the inventive concept has been particularly shown and described with reference to the one or more embodiments and the accompanying drawings, the one or more embodiments of the disclosure are not limited thereto, and it should be understood that various changes in form and details may be made therein without departing from the spirit and scope of the following claims.

What is claimed is:

1. A method of testing a memory device including a plurality of memory banks and a memory built-in self-test (MBIST) circuit, wherein the plurality of memory banks include a plurality of memory cells, and the MBIST circuit performs a double data rate (DDR) test or a parallel bit test (PBT), the method comprising:
   setting an MBIST option, the MBIST option comprises a DDR test mode and a PBT test mode;
   based on the PBT test mode being set as the MBIST option, performing the PBT test on the plurality of memory banks;
   based on the DDR test mode being set as the MBIST option, performing the DDR test on one bank selected from among the plurality of memory banks;
   based on detecting a defective cell as a result of the DDR test or the PBT test, performing a repair operation for repairing the defective cell with a redundancy cell through the MBIST circuit; and
   performing a re-test for verifying the repair operation through the MBIST circuit, wherein the re-test is performed on one or more memory cells including the defective cell among the plurality of memory cells.

2. The method of claim 1, further comprising generating an internal clock signal having a highest frequency used in an operation for testing the memory device,
   wherein the MBIST circuit is configured to perform the PBT test or the DDR test by using the internal clock signal.

3. The method of claim 1, further comprising providing information regarding the defective cell to a memory controller connected to the memory device through the MBIST circuit,
   wherein the defective cell is detected based on a comparison of a logic state output from each of the plurality of memory cells in response to same write data input to each of the plurality of memory cells.

4. The method of claim 1, wherein the MBIST option further comprises an MBIST repair option for repairing the defective cell and an MBIST auto repair option for automatically repairing the defective cell.

5. The method of claim 1, wherein the performing of the PBT test comprises:
   generating a plurality of PBT patterns by a test pattern generation (TPG) circuit of the MBIST circuit;
   executing the PBT test on the plurality of memory banks by using patterns in an enable state from among the plurality of PBT patterns; and
   not executing the PBT test on the plurality of memory banks by using patterns in a disable state from among the plurality of PBT patterns.

6. The method of claim 1, wherein the performing of the DDR test comprises:
   generating a plurality of DDR patterns by a test pattern generation (TPG) circuit of the MBIST circuit;
   executing the DDR test for a selected one memory bank by using patterns in an enable state from among the plurality of DDR patterns; and
   not executing the DDR test on the selected one memory bank by using patterns in a disable state from among a plurality of PBT patterns.

7. The method of claim 1, wherein the performing of the repair operation for repairing the defective cell with the redundancy cell through the MBIST circuit comprises:
   outputting a fail flag signal indicating that the defective cell has been detected;
   outputting a fail cell address of the defective cell;
   repairing each of a fail row address or a fail column address included in the fail cell address with a redundancy row address or a redundancy column address in response to the fail flag signal; and
   storing the fail row address, the fail column address, the redundancy row address corresponding to the fail row address, and the redundancy column address corresponding to the fail column address in an address storage table (AST).

8. The method of claim 1, wherein, in the performing of the re-test for verifying the repair operation through the MBIST circuit, the DDR test is performed on the one or more memory cells comprising the defective cell.

9. The method of claim 1, wherein, in the performing of the re-test for verifying the repair operation through the MBIST circuit, the PBT test is performed on all of the plurality of memory cells of the plurality of memory banks.

10. The method of claim 1, further comprising testing, by the MBIST circuit, architectural requirements of a memory physical layer (PHY) included in a memory controller connected to the memory device by using a result of the DDR test.

11. The method of claim 10, wherein the architecture requirements of the memory PHY comprise DC parameters including voltage levels and rise times and fall times of input/output signals provided to signal lines connected to the memory PHY and AC parameters including a memory access time, and setup times and hold times for the input/output signals.

12. A memory built-in self-test (MBIST) circuit for testing a memory device comprising a plurality of memory banks, the MBIST circuit comprising:
   a test pattern generating (TPG) circuit configured to generate a plurality of test patterns, the plurality of test patterns including a double data rate (DDR) test pattern and a parallel bit test (PBT) test pattern;
   a built-in redundancy analysis (BIRA) circuit configured to perform a repair operation for replacing a defective cell detected in a PBT test or a DDR test on the memory device with a redundancy cell, and store information regarding a fail cell address and a redundancy cell address in an address storage table (AST); and a built-in self-repair (BISR) control circuit configured to output BISR signals to perform the repair operation in response to a fail flag signal indicating that the defective cell has been detected, wherein the TPG circuit is further configured to perform a re-test on one or more memory cells including the defective cell among a plurality of memory cells to verify the repair operation through the BIRA circuit.

13. A memory device comprising:

a plurality of memory banks, each of the plurality of memory banks comprising a plurality of memory cells;

a control circuit configured to control an operation of the memory device, wherein the control circuit comprises a mode register that provides operational options of the memory device, and a test mode register that provides test mode options comprising a parallel bit test (PBT) test mode and a double data rate (DDR) test mode; and a memory built-in self-test (MBIST) circuit configured to test the plurality of memory banks in the DDR test mode or the PBT test mode, wherein the MBIST circuit is further configured to perform a repair operation for replacing a defective cell detected in the PBT test or the DDR test with a redundancy cell, and perform a re-test on only a portion of the plurality of memory cells including the defective cell to verify the repair operation.

14. The memory device of claim 13, further comprising a clock generator configured to generate an internal clock signal having a highest frequency used in an operation for testing the memory device, wherein the internal clock signal has a clock frequency higher than that of an external clock signal applied to the memory device, the external clock signal is used in a normal DDR mode of the memory device, and the internal clock signal is used in the PBT test mode or the DDR test mode.

15. The memory device of claim 13 wherein the MBIST circuit comprises a test pattern generation (TPG) circuit configured to:

generate a plurality of test patterns including a DDR test pattern and a PBT test pattern.

16. The memory device of claim 15, wherein the TPG circuit is further configured to perform the DDR test on the portion of the plurality of memory cells including the defective cell by using the DDR test pattern during the re-test.

17. The memory device of claim 15, wherein the TPG circuit is further configured to perform the PBT test on all of the plurality of memory cells of the plurality of memory banks by using the PBT test pattern during the re-test.

18. The memory device of claim 13, further comprising a built-in self-repair (BISR) control circuit configured to output BISR signals to perform the repair operation in response to a fail flag signal indicating that the defective cell has been detected, wherein the defective cell is detected based on a comparison of a logic state output from each of the plurality of memory cells in response to same write data input to each of the plurality of memory cells.

19. The memory device of claim 13, further comprising a built-in redundancy analysis (BIRA) circuit configured to:

perform the repair operation and store information regarding a fail cell address and a redundancy cell address in an address storage table (AST); and output information stored in the AST to a memory controller outside the memory device.

20. The memory device of claim 13, further comprising an input/output path test circuit configured to test architectural requirements of a memory physical layer (PHY) included in a memory controller connected to the memory device by using a result of the DDR test, wherein the architecture requirements of the memory PHY comprise DC parameters including voltage levels and rise times and fall times of input/output signals provided to signal lines connected to the memory PHY and AC parameters including a memory access time, and setup times and hold times for the input/output signals.

* * * * *